United States Patent
Sun et al.

(10) Patent No.: US 11,864,350 B2
(45) Date of Patent: Jan. 2, 2024

(54) HEAT CONDUCTION APPARATUS AND TERMINAL DEVICE

(71) Applicant: Huawei Technologies Co., Ltd., Shenzhen (CN)

(72) Inventors: Yongfu Sun, Dongguan (CN); Jian Shi, Shanghai (CN); Jie Yang, Dongguan (CN); Linfang Jin, Dongguan (CN); Zhen Sun, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/631,256

(22) PCT Filed: Jul. 23, 2020

(86) PCT No.: PCT/CN2020/103875
§ 371 (c)(1),
(2) Date: Jan. 28, 2022

(87) PCT Pub. No.: WO2021/018004
PCT Pub. Date: Feb. 4, 2021

(65) Prior Publication Data
US 2022/0279683 A1  Sep. 1, 2022

(30) Foreign Application Priority Data
Jul. 31, 2019  (CN) .......................... 201910703924.0

(51) Int. Cl.
*H05K 7/20* (2006.01)
*H05K 5/00* (2006.01)

(52) U.S. Cl.
CPC ....... *H05K 7/20336* (2013.01); *H05K 5/0017* (2013.01); *H05K 7/2099* (2013.01)

(58) Field of Classification Search
CPC . H05K 7/20336; H05K 7/2099; H05K 5/0017
See application file for complete search history.

(56) References Cited

U.S. PATENT DOCUMENTS 11,137,215 B2 * 10/2021 Toratani .............. F28D 15/0233
2002/0020518 A1 * 2/2002 Li ....................... F28D 15/0233
165/104.11

(Continued)

FOREIGN PATENT DOCUMENTS

CN  202142519 U  2/2012
CN  102466423 A  5/2012

(Continued)

*Primary Examiner* — Mukundbhai G Patel
(74) *Attorney, Agent, or Firm* — SLATER MATSIL, LLP

(57) ABSTRACT

A heat conduction apparatus includes a first cover plate and a second cover plate. The first cover plate is hermetically connected to the second cover plate. The first cover plate is provided with a plurality of grooves. A supporting portion is formed between two adjacent grooves. A liquid circulation channel and a vapor circulation channel are formed in the groove. The liquid circulation channel is filled with a liquid working medium. The liquid circulation channel is communicated with the vapor circulation channel. The liquid working medium vaporizes into vapor. The vapor enters the vapor circulation channel and condenses into liquid. The liquid enters the liquid circulation channel.

20 Claims, 8 Drawing Sheets

(56) References Cited

U.S. PATENT DOCUMENTS

| | | | | |
|---|---|---|---|---|
| 2009/0056911 A1* | 3/2009 | Hongo | ............... | H01L 23/427 |
| | | | | 165/80.4 |
| 2010/0258278 A1* | 10/2010 | Moon | ............... | H01L 23/427 |
| | | | | 165/104.21 |
| 2015/0198380 A1* | 7/2015 | Haj-Hariri | ............ | F28F 13/187 |
| | | | | 62/3.2 |
| 2018/0146539 A1* | 5/2018 | Zhang | ............... | H05K 1/0203 |
| 2018/0372418 A1 | 12/2018 | Chiang et al. | | |

FOREIGN PATENT DOCUMENTS

| | | | |
|---|---|---|---|
| CN | 102646651 A | 8/2012 | |
| CN | 105865241 A | 8/2016 | |
| CN | 205488104 U | 8/2016 | |
| CN | 106066130 A | 11/2016 | |
| CN | 106323060 A | 1/2017 | |
| CN | 107249283 A | 10/2017 | |
| CN | 206556484 U | 10/2017 | |
| CN | 107613700 A | 1/2018 | |
| CN | 109413930 A | 3/2019 | |
| CN | 110572981 A | 12/2019 | |
| KR | 101508877 B1 | 4/2015 | |
| TW | 201842296 A | 12/2018 | |
| WO | 2019065864 A1 | 4/2019 | |

* cited by examiner

HEAT CONDUCTION APPARATUS AND TERMINAL DEVICE

CROSS-REFERENCE TO RELATED APPLICATIONS

This application is a national stage of International Application No. PCT/CN2020/103875, filed on Jul. 23, 2020, which claims priority to Chinese Patent Application No. 201910703924.0, filed on Jul. 31, 2019. Both of the aforementioned applications are hereby incorporated by reference in their entireties.

TECHNICAL FIELD

This application relates to the field of heat dissipation device technologies, and in particular, to a heat conduction apparatus and a terminal device.

BACKGROUND

As a mobile phone becomes increasingly intelligent, more heat is generated due to an upgrade of a clock speed of the mobile phone. Excessive heat causes an excessive increase in a temperature of the mobile phone, thereby affecting heat dissipation. To resolve a heat dissipation problem of the mobile phone, a vapor chamber (vapor chamber, VC) is usually disposed in the mobile phone.

The vapor chamber is a vacuum cavity whose inner wall has a fine structure and into which a working medium is injected. Currently, a commonly used material is copper, and the working medium is pure water. An operating principle of the VC includes four steps: conduction, evaporation, convection, and solidification. Heat generated by a heat source enters the vapor chamber through heat conduction, and a working medium near a location of the heat source absorbs the heat and vaporizes, and takes away a large amount of heat. Then with a latent heat property of vapor, when vapor in the vapor chamber diffuses from a high-pressure region to a low-pressure region (that is, a low-temperature region) and the vapor is contact with an inner wall with a relatively low temperature, the vapor condenses into a liquid state and releases thermal energy. The working medium that condenses into the liquid state returns to the location of the heat source under an action of a capillary force of the fine structure. This completes a heat conduction cycle and forms a circulation system in which both a vapor phase and a liquid phase of the working medium exist. Currently, based on the development of mobile phone technologies, how to use a vapor chamber for heat dissipation in a mobile phone and how to implement a thin design of the vapor chamber have become issues that urgently need to be addressed by persons skilled in the art.

SUMMARY

Technical solutions of this application provide a heat conduction apparatus and a terminal device, to simplify a structure of the heat conduction apparatus while implementing a heat conduction function of the heat conduction apparatus.

According to a first aspect, a technical solution of this application provides a heat conduction apparatus. The heat conduction apparatus includes a first cover plate and a second cover plate. The first cover plate is hermetically connected to the second cover plate. The first cover plate is provided with a plurality of grooves. A supporting portion is formed between two adjacent grooves. The supporting portion may be configured to support the second cover plate, to prevent the second cover plate from collapsing. In addition, to implement heat conduction, a liquid circulation channel and a vapor circulation channel that are communicated with each other may be formed in the groove. The liquid circulation channel is filled with a liquid working medium. The liquid working medium may vaporize into vapor, and the vapor enters the vapor circulation channel. After the vapor condenses into liquid, the liquid may enter the liquid circulation channel. Therefore, when the heat conduction apparatus is in use, the first cover plate and a heat emitting element may be disposed close to each other. In this way, liquid in the liquid circulation channel may absorb heat generated by the heat emitting element and vaporize into vapor, and then the vapor enters the vapor circulation channel. When the vapor in the vapor circulation channel flows to a relatively cold end away from the heat emitting element, the vapor may condense into liquid, and the liquid enters the liquid circulation channel. In this way, heat dissipation is implemented for the heat emitting element through vapor-liquid circulation of the liquid working medium.

In a possible implementation, to form the liquid circulation channel in the groove, a capillary adsorption structure may be formed on a side wall of the groove. The capillary adsorption structure may be a metal mesh structure or a metal powder sintered structure. The capillary adsorption structure and the groove may be integrally processed and molded, to simplify a processing technique for the first cover plate. The liquid working medium may circulate under an action of a capillary force of the capillary adsorption structure and form a concave liquid surface. A space formed between the capillary adsorption structure and the concave liquid surface serves as the liquid circulation channel. A space above the concave liquid surface serves as the vapor circulation channel. In this way, the liquid circulation channel and the vapor circulation channel are two parallel channels in the groove. This can help simplify a structure of the groove.

In a possible implementation, a hydrophilic structure or a coating may be further disposed on a surface of the capillary adsorption structure, to increase a force of absorbing the liquid working medium by the first cover plate. In addition, a hydrophobic structure or a coating may be further disposed on a part, of the second cover plate, that faces the groove, to reduce a liquid working medium adsorbed by the second cover plate.

In a possible implementation, to improve heat conduction efficiency of the heat conduction apparatus, a partitioning portion may be further disposed on the supporting portion. The partitioning portion may connect liquid circulation channels of two adjacent grooves, and connect vapor circulation channels of two adjacent grooves. In addition, the partitioning portion may be alternatively formed as a capillary adsorption structure, so that the liquid working medium can circulate in liquid circulation channels of two adjacent grooves, and the heat conduction apparatus achieves a heat equalization effect.

In a possible implementation, a thickness of the first cover plate may be 0.01 mm to 0.3 mm, and a thickness of the second cover plate may be 0.01 mm to 0.3 mm; and/or a maximum cross-sectional width of the groove is 0.5 mm to 3 mm, and a minimum width of the supporting portion is 0.05 mm to 1 mm; and/or a distance between a bottommost end of the groove and a surface of one side, of the first cover plate, that is away from the second cover plate is 0.01 mm to 0.1 mm. In this way, an overall thickness of the heat conduction apparatus can be relatively small, thereby facilitating a thin design of the heat conduction apparatus.

In addition, the groove may have a plurality of cross-sectional shapes, for example, a triangular shape, a trapezoidal shape, or a polygonal shape. When a cross-sectional shape of the groove is a triangular shape, an included angle between two side walls of the groove may be set to 0° to 100°. When a cross-sectional shape of the groove is a trapezoidal shape, an included angle between a bottom wall and a side wall of the groove may be set to 90° to 100°. When a cross-sectional shape of the groove is a polygonal shape, an included angle between two adjacent side walls of the groove may be set to 90° to 100°. In addition, a cross-sectional shape of a bottom of the groove may be alternatively an arc shape. In this way, the groove can effectively adsorb the liquid working medium.

In a possible implementation, the second cover plate may be further provided with grooves. In this case, the grooves of the second cover may face the grooves of the first cover plate, and the liquid circulation channel may be formed at a junction between the first cover plate and the second cover plate. In this case, the vapor circulation channel is in a middle part, so that a size of the vapor circulation channel can be effectively increased, and resistance to vapor circulation can be reduced, thereby helping improve heat conduction efficiency of the heat conduction apparatus.

According to a second aspect, a technical solution of this application further provides a terminal device. The terminal device includes a display, a middle frame, a rear housing, a printed circuit board, and the heat conduction apparatus in the first aspect. The printed circuit board and the display are located on two sides of the middle frame. A heat emitting element is disposed on the printed circuit board. In addition, a shielding can covers the heat emitting element. The heat emitting element is in contact with the shielding can through a thermal interface material. The shielding can is in contact with the middle frame through a thermal interface material. The rear housing is located on one side of the printed circuit board. The heat conduction apparatus is disposed in the middle frame.

In a possible implementation, when the heat conduction apparatus is disposed in the middle frame, the heat conduction apparatus is specifically disposed between the middle frame and the display, and the heat conduction apparatus is fixed to the middle frame. Optionally, an accommodation slot is provided in the middle frame, an opening of the accommodation slot faces the display, and the heat conduction apparatus is accommodated in the accommodation slot.

In addition, a highly thermally conductive material layer may be further disposed between the middle frame and the display. The highly thermally conductive material layer is bonded to the middle frame, to improve heat dissipation efficiency for the terminal device.

In this technical solution of this application, heat generated by the heat emitting element of the terminal device may be conducted to the shielding can through the thermal interface material, and then conducted to the middle frame through the thermal interface material between the shielding can and the middle frame, and then conducted to the heat conduction apparatus through the middle frame. Then the heat conduction apparatus disperses the heat in the middle frame. The heat may be conducted to the rear housing through convection and radiation by the middle frame, and the heat is transferred to the highly thermally conductive material layer and then conducted to the display through convection and radiation by the middle frame. Finally, the heat is dissipated out of the terminal device through the rear housing and the display.

According to a third aspect, a technical solution of this application further provides a terminal device. The terminal device includes a display, a middle frame, a rear housing, a printed circuit board, and the heat conduction apparatus in the first aspect. The printed circuit board and the display are located on two sides of the middle frame. A heat emitting element is disposed on the printed circuit board. In addition, an accommodation slot is provided in the middle frame, an opening of the accommodation slot faces the rear housing, and the heat conduction apparatus is accommodated in the accommodation slot. The heat emitting element is disposed between the printed circuit board and the middle frame, and a shielding can cover the heat emitting element. The heat emitting element is in contact with the shielding can through a thermal interface material. The shielding can is in contact with the heat conduction apparatus through a thermal interface material. The rear housing is located on one side of the printed circuit board.

In addition, a highly thermally conductive material layer may be further disposed between the middle frame and the display. The highly thermally conductive material layer is bonded to the middle frame, to improve heat dissipation efficiency for the terminal device.

In this technical solution of this application, heat generated by the heat emitting element of the terminal device may be conducted to the shielding can through the thermal interface material, and then conducted to the heat conduction apparatus through the thermal interface material between the shielding can and the heat conduction apparatus. The heat conduction apparatus disperses the heat in the middle frame. Then the heat may be conducted to the rear housing through convection and radiation by the middle frame, and the heat is transferred to the highly thermally conductive material layer and then conducted to the display through convection and radiation by the middle frame. Finally, the heat is dissipated out of the terminal device through the rear housing and the display.

According to a fourth aspect, a technical solution of this application further provides a terminal device. The terminal device includes a display, a middle frame, a rear housing, a printed circuit board, and the heat conduction apparatus in the first aspect. The printed circuit board and the display are located on two sides of the middle frame. A heat emitting element is disposed on the printed circuit board. In addition, a shielding can covers the heat emitting element, and a heat pipe is disposed between the shielding can and the middle frame. The heat emitting element is in contact with the shielding can through a thermal interface material. The shielding can is in contact with the heat pipe through a thermal interface material. The heat pipe is in contact with the middle frame through a thermal interface material. The rear housing is located on one side of the printed circuit board. The heat conduction apparatus is disposed in the middle frame.

In a possible implementation, when the heat conduction apparatus is disposed in the middle frame, the heat conduction apparatus is specifically disposed between the middle frame and the display, and the heat conduction apparatus is fixed to the middle frame. Optionally, an accommodation slot is provided in the middle frame, an opening of the accommodation slot faces the display, and the heat conduction apparatus is accommodated in the accommodation slot.

In addition, a highly thermally conductive material layer may be further disposed between the middle frame and the display. The highly thermally conductive material layer is bonded to the middle frame, to improve heat dissipation efficiency for the terminal device.

In this technical solution of this application, heat generated by the heat emitting element of the terminal device may be conducted to the shielding can through the thermal interface material, and then conducted to the heat pipe through the thermal interface material between the shielding can and the middle frame. Then the heat disperses in the heat pipe, and is conducted to the middle frame through the thermal interface material between the heat pipe and the middle frame, and then conducted to the heat conduction apparatus through the middle frame. Then the heat conduction apparatus disperses the heat in the middle frame. The heat may be conducted to the rear housing through convection and radiation by the middle frame, and the heat is transferred to the highly thermally conductive material layer and then conducted to the display through convection and radiation by the middle frame. Finally, the heat is dissipated out of the terminal device through the rear housing and the display.

According to a fifth aspect, a technical solution of this application further provides a terminal device. The terminal device includes a display, a middle frame, a rear housing, a printed circuit board, and the heat conduction apparatus in the first aspect. The printed circuit board and the display are located on two sides of the middle frame. A heat emitting element is disposed on the printed circuit board. A shielding can covers the heat emitting element. A via is provided on the shielding can. A thermal interface material passes through the via and is in contact with the heat emitting element. The middle frame is in contact with the thermal interface material. The rear housing is located on one side of the printed circuit board. The heat conduction apparatus is disposed in the middle frame.

In a possible implementation, when the heat conduction apparatus is disposed in the middle frame, the heat conduction apparatus is specifically disposed between the middle frame and the display, and the heat conduction apparatus is fixed to the middle frame. Optionally, an accommodation slot is provided in the middle frame, an opening of the accommodation slot faces the display, and the heat conduction apparatus is accommodated in the accommodation slot.

In addition, a highly thermally conductive material layer may be further disposed between the middle frame and the display. The highly thermally conductive material layer is bonded to the middle frame, to improve heat dissipation efficiency for the terminal device.

In this technical solution of this application, heat generated by the heat emitting element of the terminal device may be conducted to the middle frame through the thermal interface material that passes through the via of the shielding can, and then conducted to the heat conduction apparatus through the middle frame. Then the heat conduction apparatus disperses the heat in the middle frame. The heat may reach the rear housing through convection and radiation by the middle frame. In addition, the heat is transferred to the highly thermally conductive material layer and then conducted to the display through convection and radiation by the middle frame. Finally, the heat is dissipated out of the terminal device through the rear housing and the display.

According to a sixth aspect, a technical solution of this application further provides a terminal device. The terminal device includes a display, a middle frame, a rear housing, a printed circuit board, and the heat conduction apparatus in the first aspect. The printed circuit board and the display are located on two sides of the middle frame. A heat emitting element is disposed on the printed circuit board. In addition, an accommodation slot is provided in the middle frame, an opening of the accommodation slot faces the rear housing, and the heat conduction apparatus is accommodated in the accommodation slot. The heat emitting element is disposed between the printed circuit board and the middle frame, and a shielding can covers the heat emitting element. A via is provided on the shielding can. A thermal interface material passes through the via and is in contact with the heat emitting element. The heat conduction apparatus is in contact with the thermal interface material. The rear housing is located on one side of the printed circuit board.

In addition, a highly thermally conductive material layer may be further disposed between the middle frame and the display. The highly thermally conductive material layer is bonded to the middle frame, to improve heat dissipation efficiency for the terminal device.

In this technical solution of this application, heat generated by the heat emitting element of the terminal device may be conducted to the heat conduction apparatus through the thermal interface material that passes through the via of the shielding can, and the heat conduction apparatus disperses the heat in the middle frame. The heat may reach the rear housing through convection and radiation by the middle frame. In addition, the heat is transferred to the highly thermally conductive material layer and then conducted to the display through convection and radiation by the middle frame. Finally, the heat is dissipated out of the terminal device through the rear housing and the display.

According to a seventh aspect, a technical solution of this application further provides a terminal device, including a display, a middle frame, a rear housing, a printed circuit board, and the heat conduction apparatus in the first aspect.

The printed circuit board and the display are located on two sides of the middle frame.

A heat emitting element is disposed on the printed circuit board. A shielding can covers the heat emitting element. The shielding can is in contact with the middle frame through a thermal interface material.

The rear housing is located on one side of the printed circuit board.

An accommodation slot is provided in the middle frame. An opening of the accommodation slot faces the display. The heat conduction apparatus is accommodated in the accommodation slot.

A highly thermally conductive material layer is disposed between the middle frame and the display. The highly thermally conductive material layer is bonded to the middle frame. The highly thermally conductive material layer is a graphite layer.

The heat conduction apparatus includes a first cover plate and a second cover plate. The first cover plate is hermetically connected to the second cover plate.

The first cover plate is provided with a plurality of grooves. A supporting portion is formed between two adjacent grooves.

A liquid circulation channel and a vapor circulation channel are formed in the groove. The liquid circulation channel is filled with a liquid working medium. The liquid circulation channel is communicated with the vapor circulation channel. The liquid working medium vaporizes into vapor, the vapor enters the vapor circulation channel and condenses into liquid, and the liquid enters the liquid circulation channel.

A capillary adsorption structure is formed on a side wall of the groove. The capillary adsorption structure and the groove are integrally processed and molded.

A thickness of the first cover plate is 0.01 mm to 0.3 mm, and a thickness of the second cover plate is 0.01 mm to 0.3 mm; and/or a distance between a bottommost end of the groove and a surface of one side, of the first cover plate, that is away from the second cover plate is 0.01 mm to 0.1 mm.

In this technical solution of this application, an overall thickness of the heat conduction apparatus of the terminal device is relatively small, thereby facilitating a thin design of the heat conduction apparatus. When the heat conduction apparatus is applied to the terminal device, the first cover plate and the heat emitting element of the terminal device may be disposed close to each other. In this way, heat generated by the heat emitting element may be conducted to the middle frame through the shielding can and the thermal interface material, and then conducted to the heat conduction apparatus through the middle frame. Then liquid in the liquid circulation channel of the heat conduction apparatus may absorb the heat and vaporize into vapor, and then the vapor enters the vapor circulation channel. When the vapor in the vapor circulation channel flows to a relatively cold end away from the heat emitting element, the vapor may condense into liquid, and the liquid enters the liquid circulation channel. In this way, the heat conduction apparatus disperses the heat in the middle frame. In addition, the heat may be conducted to the rear housing through convection and radiation by the middle frame, and the heat is transferred to the highly thermally conductive material layer and then conducted to the display through convection and radiation by the middle frame. Finally, the heat is dissipated out of the terminal device through the rear housing and the display, to implement heat dissipation for the terminal device.

DETAILED DESCRIPTION OF ILLUSTRATIVE EMBODIMENTS

For ease of understanding a heat conduction apparatus provided in the embodiments of this application, the following first describes an application scenario of the heat conduction apparatus provided in the embodiments of this application. The heat conduction apparatus may be disposed in a terminal device such as a mobile phone, a tablet computer, or a personal digital assistant (personal digital assistant, PDA), and may disperse, in the terminal device, heat generated by a heat emitting element such as a chip in the terminal device. The heat emitting element includes but is not limited to a central processing unit (central processing unit, CPU), an artificial intelligence (artificial intelligence, AI) processor, a system on chip (system on chip, SoC), a power management unit, or another device that requires heat dissipation. With reference to the accompanying drawings, the following describes in detail a specific manner of disposing the heat conduction apparatus in the terminal device, to facilitate understanding of a process in which the heat conduction apparatus performs heat conduction for the heat emitting element.

Figure 1:
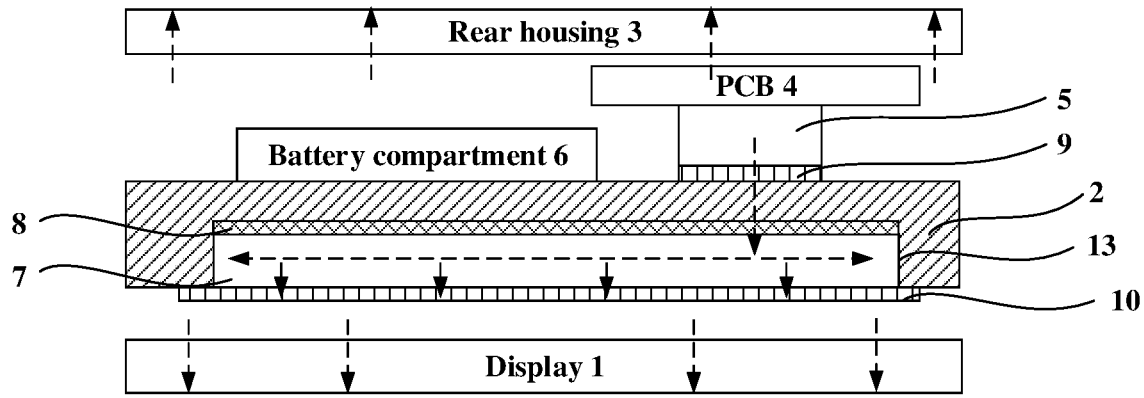
FIG. 1 is a schematic diagram of a structure of a terminal device according to an embodiment of this application.

Referring to FIG. 1, in an embodiment of this application, a terminal device includes a display 1, a middle frame 2, a rear housing 3, a printed circuit board (printed circuit board, PCB 4), and a heat conduction apparatus 7. The middle frame 2 may be configured to carry the printed circuit board and the display 1. The display 1 and the printed circuit board are located on two sides of the middle frame 2. The rear housing 3 is located on one side of the printed circuit board. A heat emitting element (for ease of description, an example in which the heat emitting element is a CPU 5 is used below for description) is disposed on the PCB 4 and is located between the PCB 4 and the middle frame 2. The CPU 5 is in contact with the middle frame 2. The heat conduction apparatus 7 is disposed in the middle frame 2, and the heat conduction apparatus 7 faces the CPU 5. In this way, heat generated by the CPU 5 may be conducted to the middle frame 2, and then conducted to the heat conduction apparatus 7 through the middle frame 2, and the heat conduction apparatus 7 disperses the heat. In addition, the heat may be further transferred to the rear housing 3 and the display 1 through convection and radiation by the middle frame 2, and the heat is dissipated out of the terminal device through the rear housing 3 and the display 1.

Referring to FIG. 1, when the heat conduction apparatus 7 is specifically disposed in the terminal device, an accommodation slot 13 facing the heat emitting element may be provided in the middle frame 2, and an opening of the accommodation slot 13 faces the display 1. In this way, the heat conduction apparatus 7 may be disposed in the accommodation slot 13. The heat conduction apparatus 7 may be bonded to a slot bottom of the accommodation slot 13 by using a bonding agent such as an adhesive 8. The adhesive 8 may be but is not limited to a double-sided tape. Alternatively, the heat conduction apparatus may snap into the accommodation slot 13, so that the heat conduction apparatus 7 can be fixed to the middle frame 2, and a connection of the heat conduction apparatus 7 is relatively reliable. It can be understood that, in addition to the foregoing connection manner, the heat conduction apparatus 7 may be alternatively fixed to the middle frame 2 through welding or the like.

Still referring to FIG. 1, to improve conduction efficiency for the heat generated by the heat emitting element, a thermal interface material 9 may be disposed between the CPU 5 and the middle frame 2, and the CPU 5 is in contact with the middle frame 2 through the thermal interface material 9. The thermal interface material 9 may be a Tim material (Thermal Interface Material). In addition, a highly thermally conductive material layer 10 such as a graphite film may be disposed between the middle frame 2 and the display 1. The highly thermally conductive material layer 10 may be bonded to the heat conduction apparatus 7 and the middle frame 2 by using double-sided tapes. Referring to FIG. 1, conduction for the heat generated by the CPU 5 is described by using an example in which both the thermal interface material 9 and the highly thermally conductive material layer 10 are disposed in the terminal device. The heat generated by the CPU 5 may be conducted along a direction indicated by a dashed line with an arrow in FIG. 1. A conduction path for the heat may be as follows: The heat generated by the CPU 5 is conducted to the middle frame 2 through the thermal interface material 9, and then conducted to the heat conduction apparatus 7 through the middle frame 2. Heat in a part (a hot end), of the heat conduction apparatus 7, that faces the CPU 5 is relatively concentrated. Then the heat is conducted to an end (a cold end), of the heat conduction apparatus 7, that is away from the CPU 5, so that the heat is dispersed in middle frame 2. The heat may be transferred to the rear housing 3 through convection and radiation by the middle frame 2, and the heat is transferred to the highly thermally conductive material layer 10 and then conducted to the display 1 through convection and radiation by the middle frame 2. Finally, the heat is dissipated out of the terminal device through the rear housing 3 and the display 1. In addition, the heat may be further conducted to the highly thermally conductive material layer 10 through the heat conduction apparatus 7. The highly thermally conductive material layer 10 may be a graphite layer, for example, a graphite film.

Figure 2:
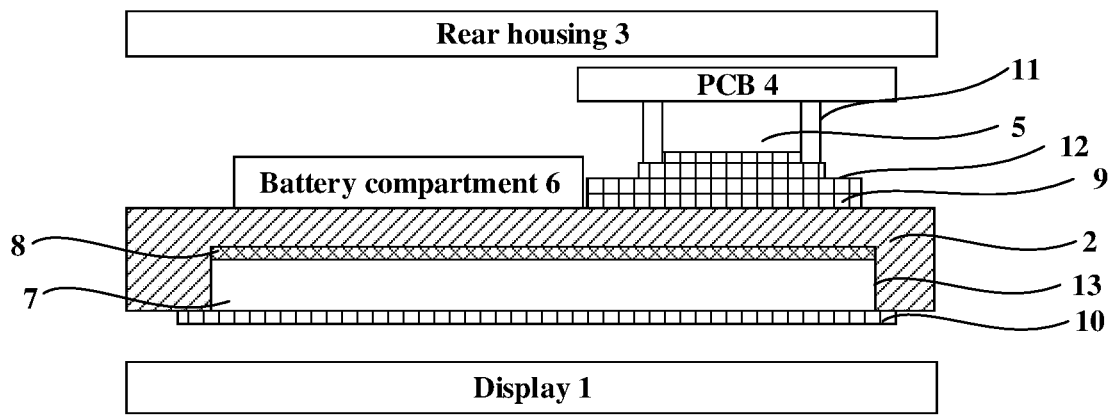
FIG. 2 is a schematic diagram of a structure of a terminal device according to another embodiment of this application.

Referring to FIG. 2, in addition to the foregoing structure, a shielding can 11 may further cover the CPU 5 in the terminal device. The shielding can 11 may be connected to a ground plane of the PCB 4. The CPU 5 may be in contact with the shielding can 11 through the thermal interface material 9. In addition, a heat pipe 12 may be further disposed between the shielding can 11 and the middle frame 2, and the heat pipe 12 is in contact with both the shielding can 11 and the middle frame 2. In addition, a via may be further provided on the shielding can 11, so that the CPU 5 can be in contact with the heat pipe 12 through the thermal interface material 9 that passes through the via. For example, the heat pipe 12 may be in contact with the middle frame 2 through the thermal interface material 9, and the heat pipe 12 may also be in contact with the shielding can 11 through the thermal interface material 9. As shown in FIG. 2, both the shielding can 11 and the heat pipe 12 are disposed in the terminal device. The CPU 5, the shielding can 11, the heat pipe 12, and the middle frame 2 are all connected through the thermal interface material 9. Conduction for the heat generated by the CPU 5 is described by using an example in which the highly thermally conductive material layer 10 is bonded to the heat conduction apparatus 7 and the middle frame 2. The heat generated by the CPU 5 is conducted to the shielding can 11 through the thermal interface material 9, and then conducted to the heat pipe 12 through the thermal interface material 9 between the shielding can 11 and the heat pipe 12. Then the heat is dispersed in the heat pipe 12, and is conducted to the middle frame 2 through the thermal interface material 9 between the heat pipe 12 and the middle frame 2, and then conducted to the heat conduction apparatus 7 through the middle frame 2. Then the heat conduction apparatus 7 disperses the heat in the middle frame 2. The heat may reach the rear housing 3 through convection and radiation by the middle frame 2, and the heat is transferred to the highly thermally conductive material layer 10 and then conducted to the display 1 through convection and radiation by the middle frame 2. Finally, the heat is dissipated out of the terminal device through the rear housing 3 and the display 1. The heat may also be conducted to the highly thermally conductive material layer 10 through the heat conduction apparatus 7.

In addition to the foregoing structure, the terminal device may be further provided with a battery compartment 6 configured to accommodate a battery. Referring to FIG. 1 and FIG. 2, the battery compartment 6 may be disposed between the middle frame 2 and the rear housing 3, and a battery of the terminal device is accommodated in the battery compartment 6. The middle frame 2 may be further configured to support the battery. Because the battery is also a heat emitting element, the heat conduction apparatus 7 may face both the CPU 5 and the battery, so that the heat conduction apparatus 7 can implement heat dissipation for the CPU 5 and the battery.

Figure 3:
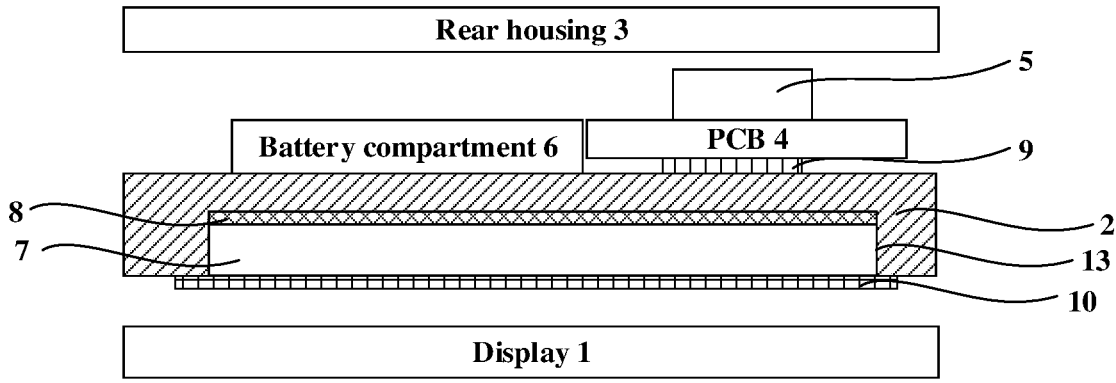
FIG. 3 is a schematic diagram of a structure of a terminal device according to another embodiment of this application.

In addition to the arrangement manner shown in FIG. 1, a structure of the terminal device may be alternatively arranged with reference to FIG. 3. In an embodiment shown in FIG. 3, a heat emitting element (for ease of description, an example in which the heat emitting element is a CPU 5 is used below for description) is disposed on the PCB 4 and is located between the PCB 4 and the rear housing 3. The PCB 4 is in contact with the middle frame 2 through a thermal interface material 9. A highly thermally conductive material layer 10 is attached to the heat conduction apparatus 7 and the middle frame 2, and faces the CPU 5. In this way, heat generated by the CPU 5 may be conducted to the middle frame 2 through the PCB 4 and the thermal interface material 9. Then the heat is transferred to the rear housing 3 through convection and radiation by the middle frame 2, and the heat is transferred to the highly thermally conductive material layer 10 and then conducted to the display 1 through convection and radiation by the middle frame 2. Finally, the heat is dissipated out of the terminal device through the rear housing 3 and the display 1. The heat may also be conducted to the highly thermally conductive material layer 10 through the heat conduction apparatus 7. The highly thermally conductive material layer 10 may be a graphite layer, for example, a graphite film.

It can be understood that neither or either of the thermal interface material 9 and the highly thermally conductive material layer 10 may be disposed.

In addition, in the embodiment shown in FIG. 3, a shielding can may cover the CPU 5. The shielding can may be connected to a ground plane of the PCB 4. The CPU 5 may be in contact with the shielding can through the thermal interface material. In addition, a heat pipe may be further disposed between the PCB 4 and the middle frame 2, and the heat pipe is in contact with both the PCB 4 and the middle frame 2. Specifically, the heat pipe may be in contact with the middle frame 2 through the thermal interface material, and the heat pipe may also be in contact with the PCB 4 through the thermal interface material 9. A heat conduction path in this embodiment is similar to that in the foregoing process. Details are not described herein again.

Figure 4:
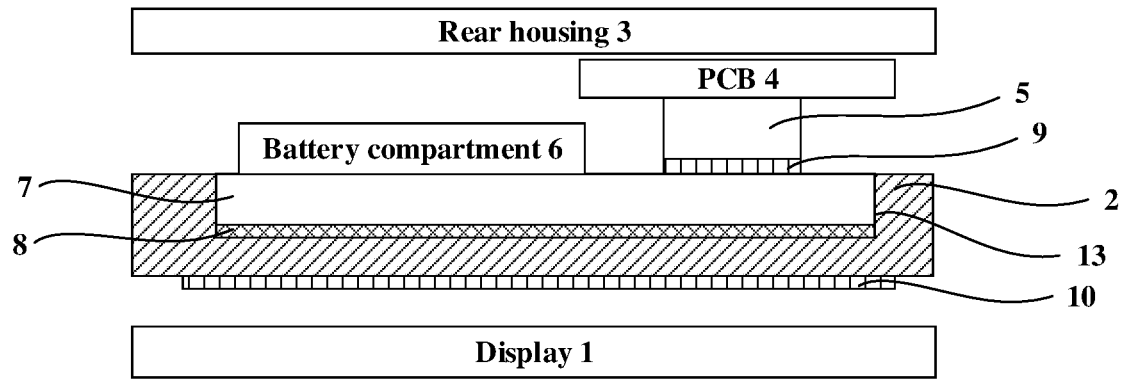
FIG. 4 is a schematic diagram of a structure of a terminal device according to another embodiment of this application.

Referring to FIG. 4, in a possible embodiment, a terminal device includes a display 1, a middle frame 2, a rear housing 3, a printed circuit board (printed circuit board, PCB 4), and a heat conduction apparatus 7. The middle frame 2 is configured to carry the printed circuit board and the display 1. The display 1 and the printed circuit board are located on two sides of the middle frame 2. The rear housing 3 is located on one side of the printed circuit board. A heat emitting element (for ease of description, an example in which the heat emitting element is a CPU 5 is used below for description) is disposed on the PCB 4, and the heat emitting element is located between the PCB 4 and the middle frame 2. The CPU 5 is in contact with the heat conduction apparatus 7. The heat conduction apparatus 7 is disposed in the middle frame 2. In this way, heat generated by the CPU 5 may be conducted to the heat conduction apparatus 7, and the heat conduction apparatus 7 disperses the heat in the middle frame 2. The heat may be further transferred to the rear housing 3 and the display 1 through convection and radiation by the middle frame 2, and the heat is dissipated out of the terminal device through the rear housing 3 and the display 1.

Referring to FIG. 4, when the heat conduction apparatus 7 is specifically disposed in the middle frame, an accommodation slot 13 may be provided in the middle frame 2, and an opening of the accommodation slot 13 faces the rear housing 3. The heat conduction apparatus 7 is accommodated in the accommodation slot 13. In this embodiment, a thermal interface material 9 may be further disposed between the CPU 5 and the heat conduction apparatus 7, and the thermal interface material 9 is in contact with the CPU 5 and the heat conduction apparatus 7. In addition, a highly thermally conductive material layer 10 such as a graphite film may be further attached to the middle frame 2. The highly thermally conductive material layer 10 is disposed between the display 1 and the middle frame 2. Referring to FIG. 4, a conduction path for the heat generated by the CPU 5 in this embodiment may be described by using an example in which both the thermal interface material 9 and the highly thermally conductive material layer 10 are disposed in the terminal device: The heat generated by the CPU 5 is conducted to the heat conduction apparatus 7 through the thermal interface material 9. Heat at a hot end, of the heat conduction apparatus 7, that directly faces the CPU 5 is relatively concentrated. A temperature difference between the hot end and an end (a cold end), of the heat conduction apparatus 7, that is away from the CPU 5 is relatively large. In this case, the heat is conducted to the cold end. In this way, the heat conduction apparatus 7 disperses the heat in the middle frame 2. The heat may be transferred to the rear housing 3 through convection and radiation by the middle frame 2, and is transferred to the highly thermally conductive material layer 10 and then conducted to the display 1 through convection and radiation by the middle frame 2. Finally, the heat is dissipated out of the terminal device through the rear housing 3 and the display 1. The heat may also be conducted to the highly thermally conductive material layer 10 through the middle frame 2.

In addition, in the embodiment shown in FIG. 4, a shielding can may alternatively cover the CPU 5, and the shielding can may be connected to a ground plane of the PCB 4. The CPU 5 may be in contact with the shielding can through the thermal interface material. In addition, a heat pipe may be further disposed between the shielding can and the middle frame 2, and the heat pipe is in contact with both the shielding can and the middle frame 2. For example, the heat pipe may be in contact with the middle frame 2 through the thermal interface material, and the heat pipe may also be in contact with the shielding can through thermal interface material 9. A heat conduction path in this embodiment is similar to that in the foregoing process. Details are not described herein again.

Figure 5:
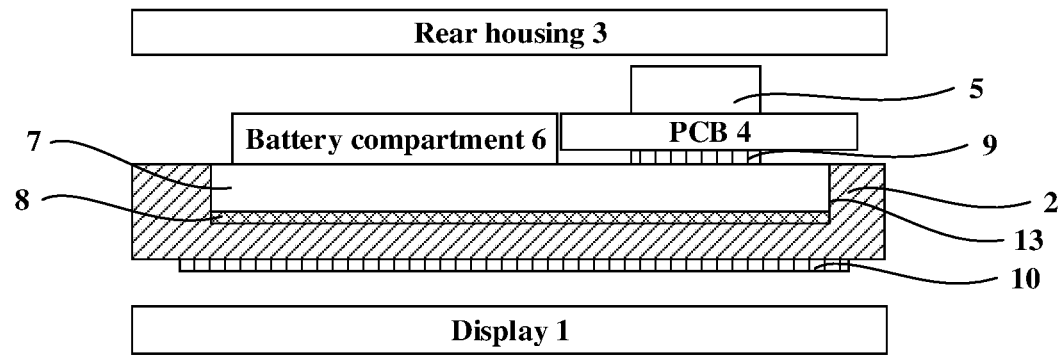
FIG. 5 is a schematic diagram of a structure of a terminal device according to another embodiment of this application.

Referring to FIG. 5, compared with the terminal device shown in FIG. 4, a heat emitting element (for ease of description, an example in which the heat emitting element is a CPU 5 is used below for description) of a terminal device shown in FIG. 5 is disposed on a PCB 4 and is located between the PCB 4 and a rear housing 3. The PCB 4 may be in contact with a heat conduction apparatus 7 through a thermal interface material. In addition, a highly thermally conductive material layer 10 may be disposed between a middle frame 2 and a display 1. The highly thermally conductive material layer 10 is attached to the middle frame 2. For example, the highly thermally conductive material layer 10 is attached to the middle frame 2 by using a double-sided tape. A conduction path for heat generated by the CPU 5 in this embodiment may be as follows: The heat generated by the CPU 5 is conducted to the heat conduction apparatus 7 through the PCB 4 and the thermal interface material 9, so that the heat conduction apparatus 7 disperses the heat in the middle frame 2. The heat may be transferred to the rear housing 3 through convection and radiation by the middle frame 2, and is transferred to the highly thermally conductive material layer 10 and then conducted to the display 1 through convection and radiation by the middle frame 2. Finally, the heat is dissipated out of the terminal device through the rear housing 3 and the display 1. The heat may also be conducted to the highly thermally conductive material layer 10 through the middle frame 2.

It can be understood that neither or either of the thermal interface material 9 and the highly thermally conductive material layer 10 may be disposed. The foregoing merely describes an example of a structure of the terminal device in this embodiment.

In addition, in the embodiment shown in FIG. 5, a shielding can may alternatively cover the CPU 5, and the shielding can may be connected to a ground plane of the PCB 4. The CPU 5 may be in contact with the shielding can through the thermal interface material. In addition, a heat pipe may be further disposed between the PCB 4 and the middle frame 2, and the heat pipe is in contact with both the PCB 4 and the middle frame 2. For example, the heat pipe may be in contact with the middle frame 2 through the thermal interface material, and the heat pipe may also be in contact with the PCB 4 through the thermal interface material 9. A heat conduction path in this embodiment is similar to that in the foregoing process. Details are not described herein again.

In all of the foregoing embodiments, the heat conduction apparatus 7 is disposed in the middle frame 2. In addition to the foregoing arrangement manner, referring to FIG. 6, the heat conduction apparatus 7 may be alternatively disposed in the rear housing 3. In an embodiment shown in FIG. 6, a terminal device includes a display 1, a middle frame 2, a rear housing 3, a printed circuit board (printed circuit board, PCB 4), and a heat conduction apparatus 7. The middle frame 2 is configured to support the display 1 and the printed circuit board. The display 1 and the printed circuit board are located on two sides of the middle frame 2. The rear housing 3 is located on one side of the printed circuit board. A heat emitting element (for ease of description, an example in which the heat emitting element is a CPU 5 is used below for description) is disposed on the PCB 4, and the heat emitting element is located between the PCB 4 and the rear housing 3. The CPU 5 is in contact with the heat conduction apparatus 7. The heat conduction apparatus 7 is disposed in the rear housing 3. In this way, heat generated by the CPU 5 may be conducted to the heat conduction apparatus 7, the heat conduction apparatus 7 may disperse the heat and then conduct the heat to the rear housing 3, and the heat is conducted out of the terminal device through the rear housing 3. In addition, heat generated by the heat emitting element may be further conducted to the middle frame 2 through the PCB 4. Then the heat is transferred to the rear housing 3 and the display 1 through convection and radiation by the middle frame 2. Finally, the heat is dissipated out of the terminal device through the rear housing 3 and the display 1.

Figure 6:
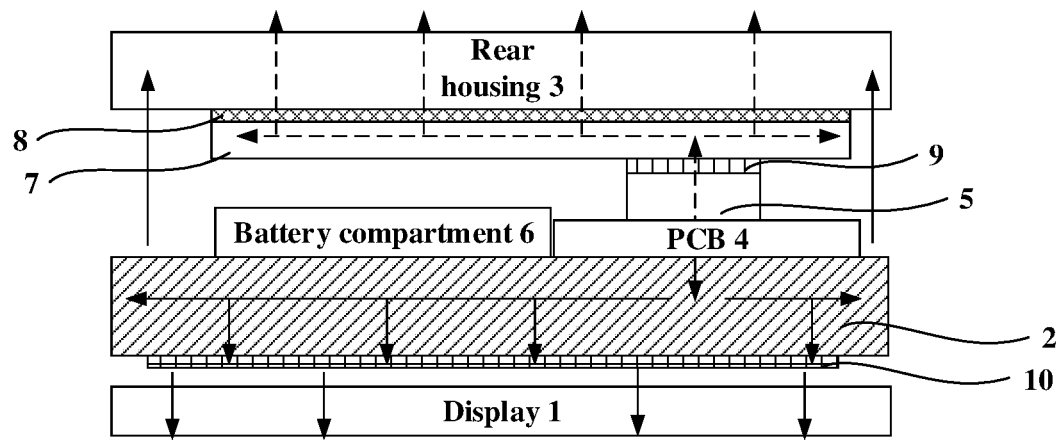
FIG. 6 is a schematic diagram of a structure of a terminal device according to another embodiment of this application.

Referring to FIG. 6, when the heat conduction apparatus 7 is specifically disposed, the heat conduction apparatus 7 may be fixed to an inner side of the rear housing 3 by using an adhesive 8 (for example, a double-sided tape). The CPU 5 may be in contact with the heat conduction apparatus 7 through a thermal interface material 9. In addition, a highly thermally conductive material layer 10 such as a graphite film may be further attached to the middle frame 2. The highly thermally conductive material layer 10 is disposed between the display 1 and the middle frame 2. Referring to FIG. 6, a conduction path for the heat generated by the CPU 5 in this embodiment is described by using an example in which both the thermal interface material 9 and the highly thermally conductive material layer 10 are disposed in the terminal device. In this embodiment, the heat generated by the CPU 5 may be conducted as two parts. One part may be conducted along a direction indicated by a dashed line with an arrow in FIG. 6. Details are as follows: The heat generated by the CPU 5 is conducted to the heat conduction apparatus 7 through the thermal interface material 9. Heat in a part (a hot end), of the heat conduction apparatus 7, that faces the CPU 5 is relatively concentrated, and the heat is conducted to an end (a cold end), of the heat conduction apparatus 7, that is away from the CPU 5. The heat is dispersed by the heat conduction apparatus 7 and is then conducted to the rear housing 3. Then the heat is conducted out of the terminal device through the rear housing 3. A conduction path for the other part of heat may be indicated by a solid line with an arrow in FIG. 6. Details are as follows: The heat generated by the CPU 5 is conducted to the middle frame 2 through the PCB 4. Then the heat is transferred to the rear housing 3 through convection and radiation by the middle frame 2, and the heat is conducted to the highly thermally conductive material layer 10 and then transferred to the display 1 through convection and radiation by the middle frame 2. Finally, the heat is dissipated out of the terminal device through the rear housing 3 and the display 1. The heat may also be conducted to the highly thermally conductive material layer 10 through the middle frame 2.

In addition, in the embodiment shown in FIG. 6, a shielding can may alternatively cover the CPU 5, and the shielding can may be connected to a ground plane of the PCB 4. The CPU 5 may be in contact with the shielding can through the thermal interface material, and the shielding can is in contact with the heat conduction apparatus 7 through the thermal interface material. In addition, a heat pipe may be further disposed between the PCB 4 and the middle frame 2, and the heat pipe is in contact with both the PCB 4 and the middle frame 2. Specifically, the heat pipe may be in contact with the middle frame 2 through the thermal interface material, and the heat pipe may also be in contact with the PCB 4 through the thermal interface material 9. A heat conduction path in this embodiment is similar to that in the foregoing process. Details are not described herein again.

Figure 7:
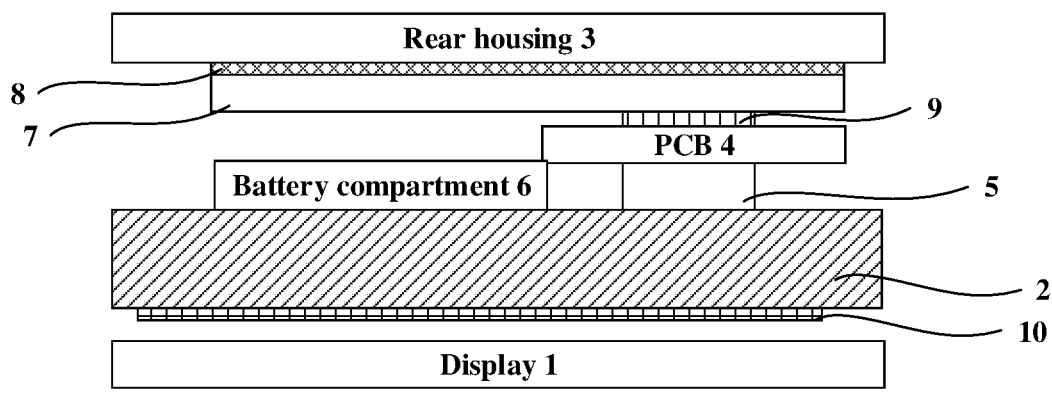
FIG. 7 is a schematic diagram of a structure of a terminal device according to another embodiment of this application.

Referring to FIG. 7, a difference from the terminal device shown in FIG. 6 lies in that, a heat emitting element (for ease of description, an example in which the heat emitting element is a CPU 5 is used below for description) of a terminal device shown in FIG. 7 is disposed on a PCB 4 and is located between the PCB 4 and a middle frame 2. The CPU 5 is in contact with the middle frame 2, and the PCB 4 is in contact with a heat conduction apparatus 7 through a thermal interface material 9. In addition, a highly thermally conductive material layer 10 is disposed between the middle frame 2 and a display 1. The highly thermally conductive material layer 10 may be attached to the middle frame 2 by using a double-sided tape. In this way, heat generated by the CPU 5 may be conducted to the heat conduction apparatus 7 through the PCB 4 and the thermal interface material 9, the heat conduction apparatus 7 may disperse the heat and then conduct the heat to a rear housing 3, and the heat is conducted out of the terminal device through the rear housing 3. Alternatively, the heat generated by the CPU 5 is conducted to the middle frame 2, and then the heat is transferred to rear housing 3 through convection and radiation by the middle frame 2. The heat may also be conducted to the highly thermally conductive material layer 10 and then transferred to the display 1 through convection and radiation by the middle frame 2. Finally, the heat is dissipated out of the terminal device through the rear housing 3 and the display 1. The heat may also be conducted to the highly thermally conductive material layer 10 through the middle frame 2.

Neither or either of the thermal interface material 9 and the highly thermally conductive material layer 10 may be disposed. In addition, the CPU 5 may be alternatively connected to the middle frame through the thermal interface material. The foregoing merely describes an example of a structure of the terminal device in this embodiment.

In addition, in the embodiment shown in FIG. 7, a shielding can may alternatively cover the CPU 5, and the shielding can is connected to a ground plane of the PCB 4. The CPU 5 may be in contact with the shielding can through the thermal interface material, and the shielding can is in contact with the middle frame 2 through the thermal interface material. In addition, a heat pipe may be further disposed between the shielding can and the middle frame 2, and the heat pipe is in contact with both the shielding can and the middle frame 2. For example, the heat pipe may be in contact with the middle frame 2 through the thermal interface material, and the heat pipe may also be in contact with the shielding can through thermal interface material 9. A heat conduction path in this embodiment is similar to that in the foregoing process. Details are not described herein again.

Figure 8:
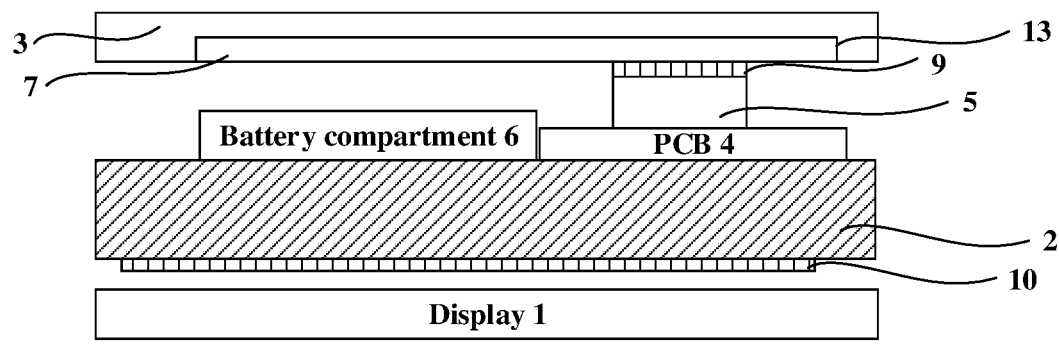
FIG. 8 is a schematic diagram of a structure of a terminal device according to another embodiment of this application.

Referring to FIG. 8, a terminal device includes a display 1, a middle frame 2, a rear housing 3, a printed circuit board (printed circuit board, PCB 4), and a heat conduction apparatus 7. The middle frame 2 is configured to carry the printed circuit board and the display 1. The rear housing 3 is located on one side of the printed circuit board. A heat emitting element (for ease of description, an example in which the heat emitting element is a CPU 5 is used below for description) is disposed on the PCB 4 and is located between the PCB 4 and the rear housing 3. The heat conduction apparatus 7 is disposed in the rear housing 3. The CPU 5 is in contact with the heat conduction apparatus 7. In this way, heat generated by the heat emitting element may be conducted to the heat conduction apparatus 7, and the heat conduction apparatus 7 may disperse the heat and then conduct the heat to the rear housing 3. The heat may be conducted out of the terminal device through the rear housing 3. Alternatively, the heat generated by the heat emitting element is conducted to the middle frame 2 through the PCB 4, and the heat is transferred to the rear housing 3 and the display 1 through convection and radiation by the middle frame 2. The heat is dissipated out of the terminal device through the rear housing 3 and the display 1.

When the heat conduction apparatus 7 is specifically disposed in the rear housing 3, an accommodation slot 13 may be provided in the rear housing 3, and an opening of the accommodation slot faces the middle frame 2. The heat conduction apparatus 7 is accommodated in the accommodation slot 13. For example, as shown in FIG. 8, the heat conduction apparatus 7 may directly snap into the accommodation slot 13 and be clamped to a slot wall of the accommodation slot 13, or may be bonded to a slot bottom of the accommodation slot 13 by using a bonding agent such as an adhesive, so that the heat conduction apparatus 7 can be fixed to the rear housing 3, and a connection of the heat conduction apparatus 7 is relatively reliable. It can be understood that, in addition to the foregoing connection manner, the heat conduction apparatus 7 may be alternatively fixed to the rear housing 3 through welding or the like. To improve conduction efficiency for the heat generated by the heat emitting element, the CPU 5 may be in contact with the heat conduction apparatus 7 through a thermal interface material 9. In addition, a highly thermally conductive material layer 10 such as a graphite film may be further attached to the middle frame 2. The highly thermally conductive material layer 10 is disposed between the display 1 and the middle frame 2.

In addition, in the embodiment shown in FIG. 8, a shielding can may alternatively cover the CPU 5, and the shielding can may be connected to a ground plane of the PCB 4. The CPU 5 may be in contact with the shielding can through the thermal interface material, and the shielding can is in contact with the heat conduction apparatus 7 through the thermal interface material. In addition, a heat pipe may be further disposed between the PCB 4 and the middle frame 2, and the heat pipe is in contact with both the PCB 4 and the middle frame 2. Specifically, the heat pipe may be in contact with the middle frame 2 through the thermal interface material, and the heat pipe may also be in contact with the PCB 4 through the thermal interface material 9. In the embodiment shown in FIG. 8, a conduction path for the heat generated by the CPU 5 is the same as the heat conduction path in the embodiment shown in FIG. 6. Details are not described herein again.

Figure 9:
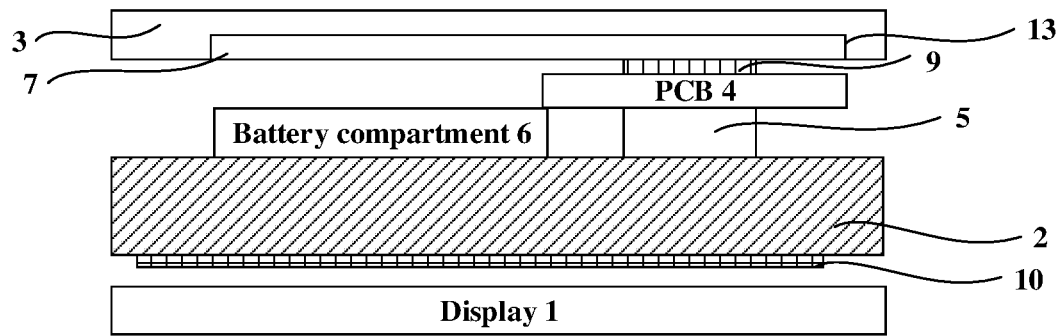
FIG. 9 is a schematic diagram of a structure of a terminal device according to another embodiment of this application.

Referring to FIG. 9, a difference from the terminal device shown in FIG. 8 lies in that, a heat emitting element (for ease of description, an example in which the heat emitting element is a CPU 5 is used below for description) of a terminal device shown in FIG. 9 is disposed on a PCB 4 and is located between the PCB 4 and a middle frame 2. The CPU 5 is in contact with the PCB 4 and the middle frame 2. A heat conduction apparatus 7 is disposed in a rear housing 3. In addition, a thermal interface material 9 may be disposed between the PCB 4 and the heat conduction apparatus 7, and a highly thermally conductive material layer 10 may be further disposed between the middle frame 2 and a display 1. In this way, heat generated by the CPU 5 may be conducted to the heat conduction apparatus 7 through the PCB 4 and the thermal interface material 9, the heat conduction apparatus 7 may disperse the heat and then conduct the heat to a rear housing 3, and the heat is conducted out of the terminal device through the rear housing 3. Alternatively, the heat generated by the CPU 5 is conducted to the middle frame 2. Then the heat is transferred to the rear housing 3 through convection and radiation by the middle frame 2, and the heat is conducted to the highly thermally conductive material layer 10 and then transferred to the display 1 through convection and radiation by the middle frame 2. Finally, the heat is dissipated out of the terminal device through the rear housing 3 and the display 1. The heat may also be conducted to the highly thermally conductive material layer 10 through the middle frame 2.

Neither or either of the thermal interface material 9 and the highly thermally conductive material layer 10 may be disposed. In addition, the CPU 5 may be alternatively connected to the middle frame through the thermal interface material.

In addition, in the embodiment shown in FIG. 9, a shielding can may further cover the CPU 5, and the shielding can is connected to a ground plane of the PCB 4. The CPU 5 may be in contact with the shielding can through the thermal interface material, and the shielding can is in contact with the middle frame 2 through the thermal interface material. In addition, a heat pipe may be further disposed between the shielding can and the middle frame 2, and the heat pipe is in contact with both the shielding can and the middle frame 2. Specifically, the heat pipe may be in contact with the middle frame 2 through the thermal interface material, and the heat pipe may also be in contact with the shielding can through thermal interface material 9. A heat conduction path in this embodiment is similar to that in the foregoing process. Details are not described herein again.

It can be understood that the middle frame in this embodiment may also be referred to as a bracket, a support structure, or the like.

For understanding a process of conducting heat by the heat conduction apparatus 7 for the heat emitting element, in addition to the manners of disposing the heat conduction apparatus 7 in the terminal device that are described in the foregoing embodiments, an internal structure and a heat conduction principle of the heat conduction apparatus 7 further need to be understood. The following describes the heat conduction apparatus 7 in detail with reference to the accompanying drawings.

Figure 10:
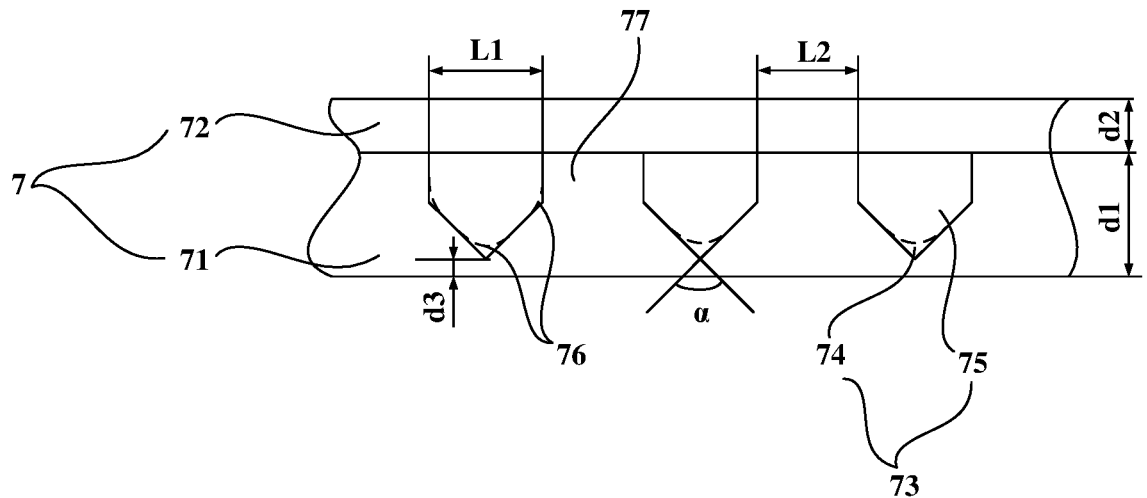
FIG. 10 is a schematic diagram of a structure of a cross section of a heat conduction apparatus according to an embodiment of this application.

FIG. 10 is a cross-sectional view of the heat conduction apparatus 7 according to an embodiment. It can be learned from the figure that the heat conduction apparatus 7 includes two parts: a first cover plate 71 and a second cover plate 72. The first cover plate 71 and the second cover plate 72 may be made of a same material or different materials. For example, materials of the first cover plate 71 and the second cover plate 72 may be but are not limited to metal such as copper, a copper alloy, titanium, or a titanium alloy; or are composed of nonmetal, for example, an organic polymer material or a glass material; or are composite materials of different metal, or composite materials of metal and nonmetal. When the first cover plate 71 is specifically disposed, the first cover plate 71 may be disposed close to the heat emitting element relative to the second cover plate 72. The first cover plate 71 is provided with a plurality of grooves 73, and there is a supporting portion 77 between two adjacent grooves 73. The groove 73 may be formed by using a process such as etching or laser processing. A liquid circulation channel 74 and a vapor circulation channel 75 are formed in each groove 73. The liquid circulation channel 74 is filled with a liquid working medium. For example, the liquid working medium may be water. Vapor circulates in the vapor circulation channel 75. For example, the vapor may be water vapor. The liquid circulation channel 74 is communicated with the vapor circulation channel 75.

When the liquid circulation channel 74 and the vapor circulation channel 75 are specifically provided, a bottom wall and a side wall of the groove 73 may be formed as capillary adsorption structures. The capillary adsorption structure and the groove 73 may be integrally processed and molded, thereby simplifying a processing technique for the first cover plate 71. The capillary adsorption structure may be but is not limited to a metal mesh structure or a metal powder sintered structure. The capillary adsorption structure adsorbs liquid to form a concave liquid surface 76 shown in FIG. 10. A space formed by the capillary adsorption structure and the concave liquid surface 76 serves as the liquid circulation channel 74. The liquid may flow in the liquid circulation channel 74 under an action of a capillary force of the capillary adsorption structure. A space in the groove 73 other than the liquid circulation channel 74 serves as the vapor circulation channel 75, thereby forming, in the groove 73, a circulation channel in which vapor and liquid circulate in parallel. It can be understood that a thickness of the capillary adsorption structure is limited by a thickness of the metal mesh structure or the metal powder sintered structure. Therefore, a ratio of a volume of the liquid circulation channel 74 to a volume of the groove 73 may be adjusted as required by adjusting a thickness of an inner structure of the capillary adsorption structure. In addition, hydrophilic structures or coatings may be further disposed on surfaces of the bottom wall and the side wall of the groove 73, to increase a force of absorbing the liquid working medium by the first cover plate 71. Similarly, a hydrophobic structure or a coating may be further disposed on a part, of the second cover plate 72, that faces the groove 73, to reduce a liquid working medium adsorbed by the second cover plate 72.

When the second cover plate 72 is specifically disposed, referring to FIG. 10, the second cover plate 72 may be a flat thin cover plate. The second cover plate 72 covers the first cover plate 71, and may be in contact with the supporting portion 77 between the two adjacent grooves 73, to effectively support the second cover plate 72 and prevent the second cover plate from collapsing or the like. An edge region of the first cover plate 71 and an edge region of the second cover plate 72 may be welded through copper paste welding, electric resistance welding, diffusion welding, or the like; or certainly, may be connected in other possible manners such as bonding, provided that peripheries of the first cover plate 71 and the second cover plate 72 can be sealed. The possible manners are not listed one by one herein.

Still referring to FIG. 10, in an embodiment, when the first cover plate 71 and the second cover plate 72 are sealed to form the heat conduction apparatus 7, a thickness d1 of the first cover plate 71 is set to 0.01 mm to 0.3 mm, a thickness d2 of the second cover plate 72 is set to 0.01 mm to 0.3 mm, and a distance d3 between a bottommost end of the groove 73 and a surface of one side, of the first cover plate 71, that is away from the second cover plate 72 is set to 0.01 mm to 0.1 mm. In this way, an overall thickness of the heat conduction apparatus 7 can be relatively small, thereby facilitating a thin design of the heat conduction apparatus 7.

In a possible implementation, a cross-sectional width L1 of the groove 73 may be set to 0.5 mm to 3 mm, and a width L2 of the supporting portion 77 may be set to 0.05 mm to 1 mm. In this way, the first cover plate 71 can stably support the second cover plate 72, thereby effectively avoiding depression of the second cover plate 72 in a process of processing or using the heat conduction apparatus 7, and avoiding increasing resistance to vapor circulation in the vapor circulation channel 75 of the groove 73. In addition, referring to FIG. 10, an angle α of an included angle between two adjacent side walls of the groove 73 may be set to 0° to 100°, so that the groove 73 can effectively adsorb the liquid working medium. It can be understood that a size combination of the foregoing structures is merely an example provided in this technical solution, and another size combination may be alternatively selected as required.

Figure 11:
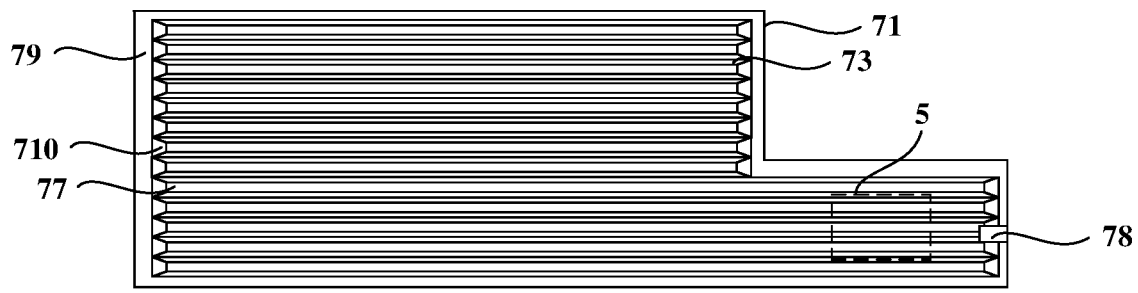
FIG. 11 is a top view of a first cover plate according to an embodiment of this application.

When the plurality of grooves 73 are specifically provided, refer to FIG. 11. FIG. 11 is a top view of the first cover plate 71 in FIG. 10. A middle region of the first cover plate 71 may be used for processing the grooves 73, and is surrounded by sealing edges 79. A liquid injection port 78 for liquid injection and vacuum pumping may be reserved on one of the sealing edges 79. A specific form of the liquid injection port 78 is not limited. Referring to FIG. 11, the liquid injection port 78 may be a small nozzle or a reserved pore structure. It can be understood that the liquid injection port 78 needs to be blocked after the liquid injection and the vacuum pumping are completed. In the embodiment shown in FIG. 11, the plurality of grooves 73 are provided in parallel and side by side, and a supporting portion 77 is formed between two adjacent grooves 73. Certainly, a shape and an arrangement manner of the grooves 73 may be alternatively adjusted based on an arrangement location of the heat emitting element and an application scenario of the heat conduction apparatus. In the figure, a dashed-line box is used to indicate the heat emitting element such as the CPU 5. However, in addition to the location shown in the figure, the heat emitting element may be alternatively disposed in another section. An end, of the heat conduction apparatus 7, that is close to the heat emitting element is the hot end of the heat conduction apparatus 7. An end away from the heat emitting element along an extension direction of the grooves 73 is the cold end of the heat conduction apparatus 7. In this case, it can be learned from FIG. 10 that liquid, near the hot end, in a liquid circulation channel 74 of each groove 73 vaporizes into vapor, the vapor enters a vapor circulation channel 75 of the groove 73, diffuses to the cold end, and condenses into liquid, and the liquid enters the liquid circulation channel 74. Then the liquid returns to the hot end under an action of a capillary force of a capillary adsorption structure of the liquid circulation channel 74. In addition, referring to FIG. 11, a diagonal plane 710 may be further provided between an end of the supporting portion 77 and the sealing edge 79, so that circulation channels of adjacent grooves 73 can be communicated at the end, to achieve temperature uniformity of the heat conduction apparatus 7.

Figure 12:
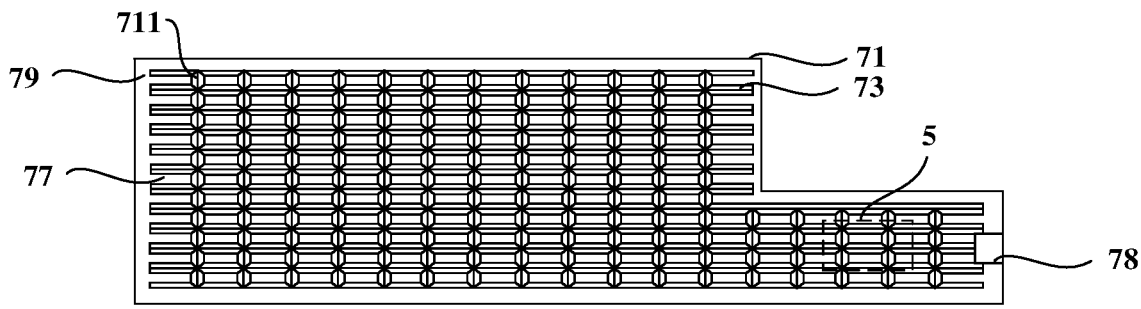
FIG. 12 is a top view of a first cover plate according to another embodiment of this application.
Figure 13:
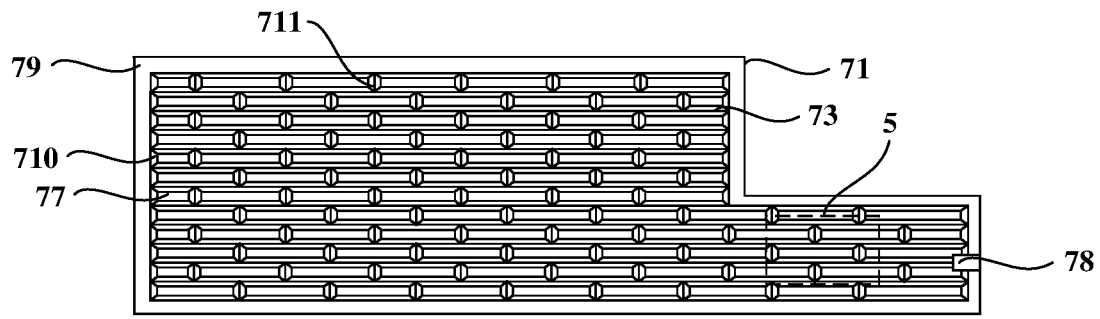
FIG. 13 is a top view of a first cover plate according to another embodiment of this application.
Figure 14:
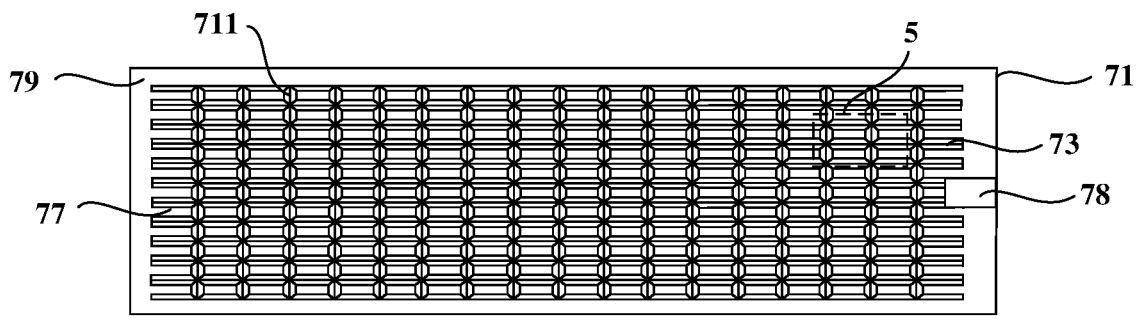
FIG. 14 is a top view of a first cover plate according to another embodiment of this application.

To achieve temperature uniformity of the heat conduction apparatus 7, a partitioning portion 711 may be further disposed on a supporting portion 77 between two adjacent grooves 73. Referring to FIG. 12, lengths of supporting sub-portions obtained by dividing the supporting portion 77 by the partitioning portion 711 are the same. Partitioning portions 711 of two adjacent supporting portions 77 are disposed in a same manner. With the partitioning portion 711, liquid circulation channels 74 of the two adjacent grooves 73 can be communicated, and vapor circulation channels 75 of the two adjacent grooves 73 can be communicated. In addition, the partitioning portion 711 does not affect circulation of working media in a liquid circulation channel 74 and a vapor circulation channel 75 of each groove 73. A cross-sectional shape of the partitioning portion 711 is not limited. As shown in FIG. 12, the cross-sectional shape of the partitioning portion 711 may be set to be the same as that of the groove 73. In addition to the arrangement manner shown in FIG. 12, partitioning portions 711 on two adjacent supporting portions 77 may be alternatively disposed in a staggered manner with reference to an embodiment shown in FIG. 13. The partitioning portions 711 may be further formed as capillary adsorption structures, to facilitate communication between liquid circulation channels 74 (refer to FIG. 10) of adjacent grooves 73. In addition, for a shape of the first cover plate 71, refer to FIG. 11 to FIG. 13. The first cover plate 71 includes a narrow-edge region and a wide-edge region. To facilitate arrangement of another component in the terminal device, the narrow-edge region may face the heat emitting element, but this does not constitute a limitation. In addition to the foregoing shape, the first cover plate 71 may be alternatively disposed in a shape shown in FIG. 14. In this case, the heat emitting element may face any region of the first cover plate 71. It can be understood that the foregoing merely describes an example of the shape of the first cover plate 71, and the shape of the first cover plate 71 may be alternatively adjusted as required.

Figure 15:
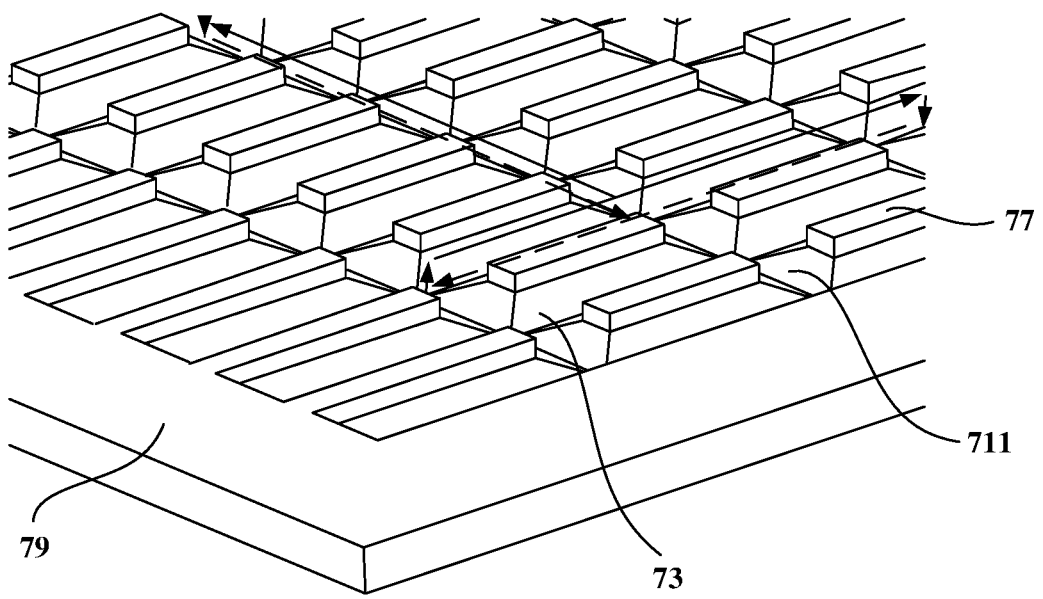
FIG. 15 is a schematic diagram of a local structure of a first cover plate according to an embodiment of this application.

The foregoing describes the heat conduction apparatus 7, mainly the structure of the first cover plate 71 of the heat conduction apparatus 7. The following describes an operating principle of the heat conduction apparatus in this technical solution with reference to FIG. 14 and FIG. 15. FIG. 15 is a schematic diagram of a partial structure of the first cover plate 71 shown in FIG. 14. In the figure, solid lines with arrows are used to indicate vapor circulation in a current groove 73 and between adjacent grooves 73, and dashed lines with arrows are used to indicate liquid circulation in a current groove 73 and between adjacent grooves 73. The operating principle of the heat conduction apparatus including the first cover plate 71 is as follows: When the heat emitting element such as the CPU generates heat, a liquid working medium in a liquid circulation channel at an end (the hot end), of the first cover plate 71, that is close to the CPU vaporizes into vapor, and the vapor enters vapor circulation channels of a current groove 73 and an adjacent groove 73. Then with a latent heat property of the vapor, when the vapor diffuses from the hot end to an end (the cold end), of the first cover plate 71, that is away from the CPU and the vapor is in contact with an inner wall with a relatively low temperature, the vapor quickly condenses into a liquid state and releases thermal energy. The working medium that condenses into the liquid state flows into liquid circulation channels of the current groove 73 and the adjacent groove 73 under an action of a capillary force of a capillary structure of the grooves 73, and returns to the hot end of the first cover plate 71. This completes a heat conduction cycle and forms a two-way circulation system in which both a vapor phase and a liquid phase of the working medium exist. Heat conduction cycles are continuously performed in the heat conduction apparatus, so that a temperature difference between all parts of the heat conduction apparatus gradually decreases to achieve a heat equalization effect. In this way, internal pressure of the heat conduction apparatus is kept balanced accordingly, so that a structure of the heat conduction apparatus is relatively stable.

Figure 16:
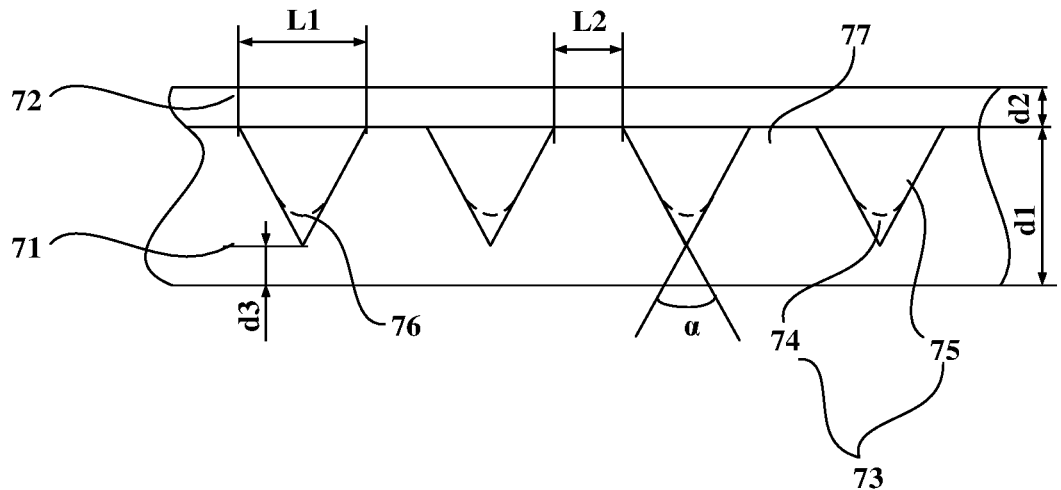
FIG. 16 is a schematic diagram of a structure of a cross section of a heat conduction apparatus according to another embodiment of this application.

For a structural form of the groove 73 of the first cover plate 71, in addition to that described in the foregoing embodiment, a cross-sectional shape of the groove 73 may be alternatively set to an inverted triangular shape shown in FIG. 16. In this embodiment, a thickness d1 of the first cover plate 71 may be set to 0.01 mm to 0.3 mm, a thickness d2 of the second cover plate 72 may be set to 0.01 mm to 0.3 mm, and a distance d3 between a bottommost end of the groove 73 and a surface of one side, of the first cover plate 71, that is away from the second cover plate 72 is 0.01 mm to 0.1 mm. In this way, an overall thickness of the heat conduction apparatus 7 can be relatively small, thereby facilitating a thin design of the heat conduction apparatus 7. In a possible implementation, a cross-sectional width L1 of the groove 73 whose cross-sectional shape is an inverted triangular shape may be set to 0.5 mm to 3 mm, and a width L2 of the supporting portion 77 may be set to 0.05 mm to 1 mm. In this way, the first cover plate 71 can stably support the second cover plate 72, thereby effectively avoiding depression of the second cover plate 72 in a process of processing or using the heat conduction apparatus 7, and avoiding increasing resistance to vapor circulation in the vapor circulation channel 75 of the groove 73. In addition, an angle α of an included angle between two side walls of the groove 73 whose cross-sectional shape is an inverted triangular shape may be set to 0° to 100°, so that a bottom of the groove 73 can effectively adsorb the liquid working medium.

Figure 17:
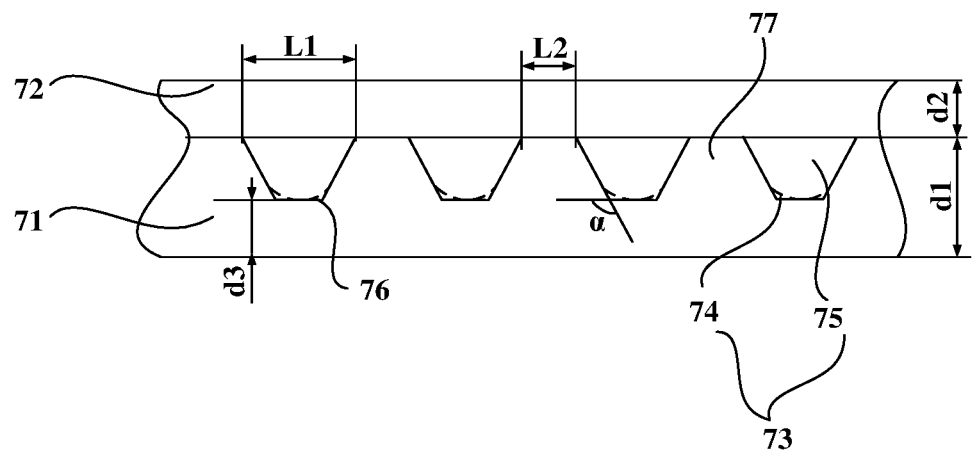
FIG. 17 is a schematic diagram of a structure of a cross section of a heat conduction apparatus according to another embodiment of this application.

In addition, as shown in FIG. 17, a cross-sectional shape of the groove may be alternatively an inverted trapezoidal shape. In this embodiment, a thickness d1 of the first cover plate 71 may be set to 0.01 mm to 0.3 mm, a thickness d2 of the second cover plate 72 may be set to 0.01 mm to 0.3 mm, and a distance d3 between a bottommost end of the groove 73 and a surface of one side, of the first cover plate 71, that is away from the second cover plate 72 is 0.01 mm to 0.1 mm. In this way, an overall thickness of the heat conduction apparatus 7 can be relatively small, thereby facilitating a thin design of the heat conduction apparatus 7. In a possible implementation, a cross-sectional width L1 of the groove 73 whose cross-sectional shape is an inverted trapezoidal shape may be set to 0.5 mm to 3 mm, and a width L2 of the supporting portion 77 may be set to 0.05 mm to 1 mm. In this way, the first cover plate 71 can stably support the second cover plate 72, thereby effectively avoiding depression of the second cover plate 72 in a process of processing or using the heat conduction apparatus 7, and avoiding increasing resistance to vapor circulation in the vapor circulation channel 75 of the groove 73. In addition, an angle α of an included angle between a bottom wall and a side wall of the groove 73 whose cross-sectional shape is an inverted trapezoidal shape may be set to 900 to 100°, so that a bottom of the groove 73 can effectively adsorb the liquid working medium.

Figure 18:
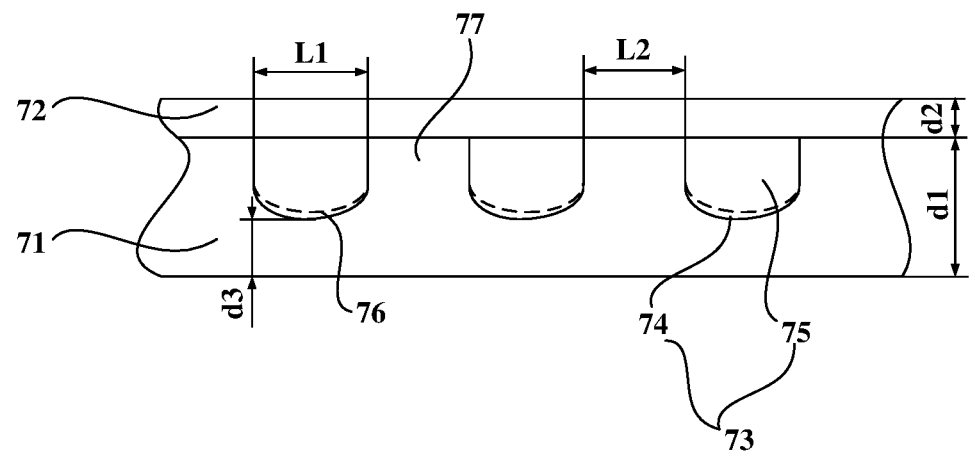
FIG. 18 is a schematic diagram of a structure of a cross section of a heat conduction apparatus according to another embodiment of this application.

As shown in FIG. 18, a cross-sectional shape of the groove 73 may alternatively include an arc shape. Specifically, a cross-sectional shape of a bottom of the groove 73 is an arc shape. In this embodiment, a thickness d1 of the first cover plate 71 may be set to 0.01 mm to 0.3 mm, a thickness d2 of the second cover plate 72 may be set to 0.01 mm to 0.3 mm, and a distance d3 between a bottommost end of the groove 73 and a surface of one side, of the first cover plate 71, that is away from the second cover plate 72 is 0.01 mm to 0.1 mm. In this way, an overall thickness of the heat conduction apparatus 7 can be relatively small, thereby facilitating a thin design of the heat conduction apparatus 7. In a possible implementation, a cross-sectional width L1 of the groove 73 may be set to 0.5 mm to 3 mm, and a width L2 of the supporting portion 77 may be set to 0.05 mm to 1 mm. In this way, the first cover plate 71 can stably support the second cover plate 72, thereby effectively avoiding depression of the second cover plate 72 in a process of processing or using the heat conduction apparatus 7, and avoiding increasing resistance to vapor circulation in the vapor circulation channel 75 of the groove 73. In addition, because the cross-sectional shape of the bottom of the groove 73 in this embodiment is an arc shape, the liquid circulation channel 74 can be provided as relatively gentle, thereby facilitating adsorption of the liquid working medium.

Figure 19:
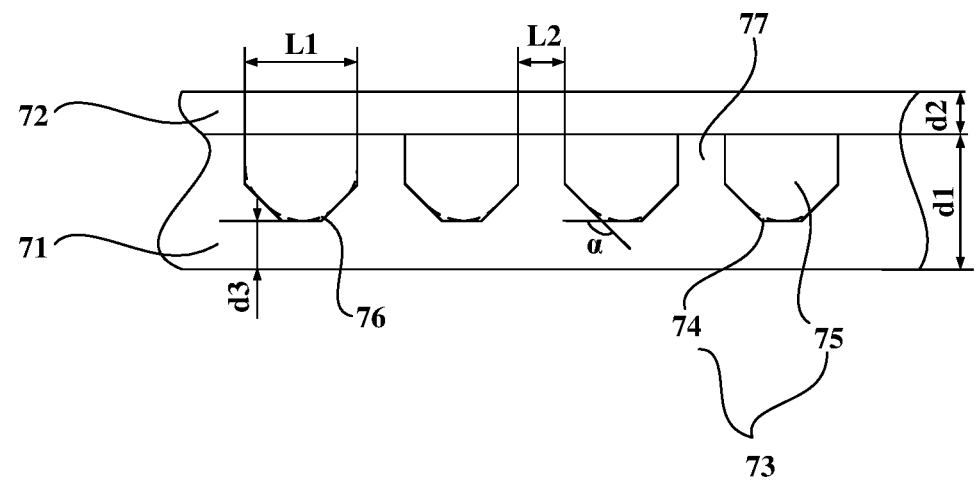
FIG. 19 is a schematic diagram of a structure of a cross section of a heat conduction apparatus according to another embodiment of this application.

In addition, a cross-sectional shape of the groove 73 may be alternatively a polygonal shape shown in FIG. 19. In this embodiment, a thickness d1 of the first cover plate 71 may be set to 0.01 mm to 0.3 mm, a thickness d2 of the second cover plate 72 may be set to 0.01 mm to 0.3 mm, and a distance d3 between a bottommost end of the groove 73 and a surface of one side, of the first cover plate 71, that is away from the second cover plate 72 is 0.01 mm to 0.1 mm. In this way, an overall thickness of the heat conduction apparatus 7 can be relatively small, thereby facilitating a thin design of the heat conduction apparatus 7. In a possible implementation, a cross-sectional width L1 of the groove 73 may be set to 0.5 mm to 3 mm, and a width L2 of the supporting portion 77 may be set to 0.05 mm to 1 mm. In this way, the first cover plate 71 can stably support the second cover plate 72, thereby effectively avoiding depression of the second cover plate 72 in a process of processing or using the heat conduction apparatus 7, and avoiding increasing resistance to vapor circulation in the vapor circulation channel 75 of the groove 73. In addition, an angle α of an included angle between two adjacent side walls of the groove 73 whose cross-sectional shape is a polygonal shape may be set to 90° to 100°, so that a bottom of the groove 73 can effectively adsorb the liquid working medium. It can be understood that the foregoing arrangements of the cross-sectional shape of the groove 73 are merely some examples of the cross-sectional shape, and the cross-sectional shape of the groove 73 may be alternatively adjusted as required.

Figure 20:
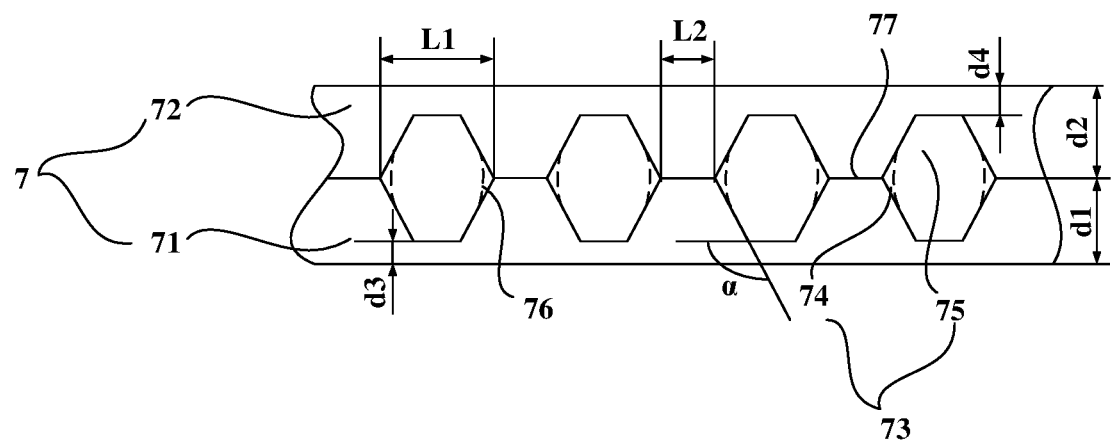
FIG. 20 is a schematic diagram of a structure of a cross section of a heat conduction apparatus according to another embodiment of this application.

In all of the foregoing embodiments, the heat conduction apparatus 7 is described by using an example in which the second cover plate 72 is disposed as a flat thin cover plate. In addition to the foregoing possible embodiments, referring to FIG. 20, grooves 73 may be alternatively provided on both the first cover plate 71 and the second cover plate 72, and grooves 73 on the first cover plate 71 may face grooves 73 on the second cover plate 72. In this case, the first cover plate 71 may be disposed close to the heat emitting element as a heat conduction plane, or the second cover plate 72 may be disposed close to the heat emitting element as a heat conduction plane. As shown in FIG. 20, the liquid circulation channel 74 may be provided at a part at which the first cover plate 71 and the second cover plate 72 are connected. In this case, the vapor circulation channel 75 is in a middle part, so that a size of the vapor circulation channel 75 can be effectively increased, and resistance to vapor circulation can be reduced, thereby helping improve heat conduction efficiency of the heat conduction apparatus 7. It can be understood that, for a heat conduction principle of the heat conduction apparatus in this embodiment, reference may be made to any one of the foregoing embodiments. Details are not described herein again. In addition, in this embodiment, cross-sectional shapes of the grooves on the first cover plate 71 and the second cover plate 72 may be but are not limited to the shapes described in the foregoing embodiments.

In the embodiment shown in FIG. 20, the first cover plate 71 and the second cover plate 72 may be disposed in a same manner or different manners. A structure of the heat conduction apparatus 7 in this embodiment is described by using an example in which the first cover plate 71 and the second cover plate 72 are disposed in a same manner. Because the first cover plate 71 and the second cover plate 72 are disposed in a same manner, the following may describe only the first cover plate 71. A thickness d1 of the first cover plate 71 is set to 0.01 mm to 0.3 mm, and a distance d3 between a bottommost end of the groove 73 and a surface of one side, of the first cover plate 71, that is away from the second cover plate 72 is 0.01 mm to 0.1 mm. This can help increase spaces of the liquid circulation channel 74 and the vapor circulation channel 75 of the heat conduction apparatus 7 formed by assembling the first cover plate 71 and the second cover plate 72 face to face, thereby helping improve heat conduction efficiency of the heat conduction apparatus 7. In a possible implementation, alternatively, a cross-sectional width L1 of the groove 73 may be set to 0.5 mm to 3 mm, and a width L2 of the supporting portion 77 may be set to 0.05 mm to 1 mm. This can effectively avoid depression of the first cover plate 71 or the second cover plate 72 in a process of processing or using the heat conduction apparatus 7, and avoid increasing resistance to vapor circulation in the vapor circulation channel 75 of the groove 73, while stably supporting the first cover plate 71 and the second cover plate 72. In addition, in the embodiment shown in FIG. 20, a cross-sectional shape of the groove 73 of the first cover plate 71 may be set to an inverted trapezoidal shape, and an angle α of an included angle at a bottom of the groove 73 may be set to 90° to 100°, so that the bottom of the groove 73 can effectively adsorb the liquid working medium. It can be understood that a size combination of the foregoing structures is merely an example provided in this technical solution, and another size combination may be alternatively selected as required.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:
1. An apparatus, comprising:
a printed circuit board;
a first cover plate; and
a second cover plate, wherein the first cover plate is hermetically connected to the second cover plate, wherein:
the first cover plate defines a first plurality of grooves, and a supporting portion is disposed between two adjacent grooves of the first plurality of grooves,
each groove of the first plurality of grooves includes a liquid circulation channel and a vapor circulation channel, each liquid circulation channel is filled with a liquid working medium, and each liquid circulation channel is in communication with the corresponding vapor circulation channel in a manner that when the liquid working medium vaporizes into vapor, the vapor enters the corresponding vapor circulation channel and condenses into liquid, and the liquid enters the corresponding liquid circulation channel, and a heat emitting element is disposed on the printed circuit board, a shielding can covers the heat emitting element, a via extends in the shielding can, a thermal interface material passes through the via and is in contact with the heat emitting element, and a middle frame is in contact with the thermal interface material.

2. The apparatus according to claim 1, wherein a capillary adsorption structure is disposed on a sidewall of each groove of the first plurality of grooves, and each capillary adsorption structure and the groove on which the respective capillary adsorption structure is disposed are integrally processed and molded.

3. The apparatus according to claim 2, wherein each capillary adsorption structure is configured to adsorb the liquid working medium to form a concave liquid surface, a space formed by the respective capillary adsorption structure and the respective concave liquid surface serves as the liquid circulation channel of the corresponding groove, and a space above the concave liquid surface of the groove serves as the vapor circulation channel of the corresponding groove.

4. The apparatus according to claim 2, wherein each capillary adsorption structure is a metal mesh structure or a metal powder sintered structure.

5. The apparatus according to claim 1, wherein a partitioning portion is disposed on the supporting portion, and the partitioning portion connects liquid circulation channels of the two adjacent grooves and vapor circulation channels of the two adjacent grooves.

6. The apparatus according to claim 5, wherein the partitioning portion is a capillary adsorption structure.

7. The apparatus according to claim 1, wherein a thickness of the first cover plate is in a range of 0.01 mm to 0.3 mm, and a thickness of the second cover plate is in a range of 0.01 mm to 0.3 mm.

8. The apparatus according to claim 1, wherein a maximum cross-sectional width of each groove is in a range of 0.5 mm to 3 mm, and a minimum width of the supporting portion is in a range of 0.05 mm to 1 mm.

9. The apparatus according to claim 1, wherein a distance between a bottommost end of each groove and a surface of a side of the first cover plate that faces away from the second cover plate is in a range of 0.01 mm to 0.1 mm.

10. The apparatus according to claim 1, wherein a cross-sectional shape of each groove is a triangular shape, and an angle between two sidewalls of each groove is in a range of 0° to 100°.

11. The apparatus according to claim 1, wherein a cross-sectional shape of each groove is a polygonal shape, and an included angle between two adjacent sidewalls of each groove is in a range of 90° to 100°.

12. The apparatus according to claim 1, wherein the second cover plate defines a second plurality of grooves, the second plurality of grooves of the second cover plate face the first plurality of grooves of the first cover plate, and the liquid circulation channel of each groove of the first plurality of grooves is formed at a junction between the first cover plate and the second cover plate.

13. The apparatus according to claim 1, further comprising:
a heat emitting element;
a shielding can covering the heat emitting element; and
a via extending in the shielding can and in contact with the heat emitting element.

14. A terminal device, comprising:
a display;
a middle frame;
a rear housing;
a printed circuit board; and
a heat conduction apparatus, comprising:
a first cover plate and a second cover plate, wherein the first cover plate is hermetically connected to the second cover plate, wherein the first cover plate defines a plurality of grooves, and a supporting portion is disposed between two adjacent grooves of the plurality of grooves, each groove of the plurality of grooves includes a liquid circulation channel and a vapor circulation channel, each liquid circulation channel is filled with a liquid working medium, and each liquid circulation channel is in communication with the corresponding vapor circulation channel in a manner that when the liquid working medium vaporizes into vapor, the vapor enters the corresponding vapor circulation channel and condenses into liquid, and the liquid enters the corresponding liquid circulation channel;
wherein the printed circuit board and the display are located on different sides of the middle frame;
wherein a heat emitting element is disposed on the printed circuit board, a shielding can covers the heat emitting element, a via extends through the shielding can a thermal interface material passes through the via and is in contact with the heat emitting element, the middle frame is in contact with the thermal interface material, and the rear housing is located on a side of the printed circuit board; and
wherein the heat conduction apparatus is disposed in the middle frame.

15. The terminal device according to claim 14, wherein the heat conduction apparatus is disposed between the middle frame and the display, and the heat conduction apparatus is fixed to the middle frame.

16. The terminal device according to claim 15, wherein the middle frame defines an accommodation slot, an opening of the accommodation slot faces the display, and the heat conduction apparatus is accommodated in the accommodation slot.

17. The terminal device according to claim 14, wherein a thermally conductive material layer is disposed between the middle frame and the display, and the thermally conductive material layer is bonded to the middle frame.

18. A terminal device, comprising:
a display;
a middle frame;
a rear housing;
a printed circuit board; and
a heat conduction apparatus, comprising:
a first cover plate and a second cover plate, wherein the first cover plate is hermetically connected to the second cover plate, the first cover plate defines a plurality of grooves, a supporting portion is disposed between two adjacent grooves of the plurality of grooves, each groove of the plurality of grooves includes a liquid circulation channel and a vapor circulation channel, each liquid circulation channel is filled with a liquid working medium, and each liquid circulation channel is in communication with the corresponding vapor circulation channel in a manner that when the liquid working medium vaporizes into vapor, the vapor enters the corresponding vapor circulation channel and condenses into liquid, and the liquid enters the corresponding liquid circulation channel;

wherein the printed circuit board and the display are located on different sides of the middle frame;

a heat emitting element is disposed on the printed circuit board, a shielding can covers the heat emitting element, a via extends in the shielding can, a thermal interface material passes through the via and is in contact with the heat emitting element, and the middle frame is in contact with the thermal interface material;

wherein the rear housing is located on a side of the printed circuit board; and wherein the heat conduction apparatus is disposed in the middle frame.

19. The terminal device according to claim 18, wherein the heat conduction apparatus is disposed between the middle frame and the display, and the heat conduction apparatus is fixed to the middle frame.

20. The terminal device according to claim 19, wherein the middle frame defines an accommodation slot, an opening of the accommodation slot faces the display, and the heat conduction apparatus is accommodated in the accommodation slot.

* * * * *